United States Patent
Antoniuk et al.

[19]

[11] Patent Number: 6,065,529
[45] Date of Patent: *May 23, 2000

[54] EMBEDDED HEAT PIPE STRUCTURE

[75] Inventors: David Antoniuk, Pacific Palisades; Jeffrey L. Baker, Huntington Beach; Garrett R. Wittkopp, Redondo Beach, all of Calif.

[73] Assignee: TRW Inc., Redondo Beach, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/782,473

[22] Filed: Jan. 10, 1997

[51] Int. Cl.⁷ .................................................... F28F 7/00
[52] U.S. Cl. ........................ 165/46; 165/41; 165/104.26; 165/81; 165/104.33
[58] Field of Search ................................. 165/104.14, 81, 165/46, 41, 185, 104.33, 204; 361/700, 687; 257/715

[56] References Cited

U.S. PATENT DOCUMENTS

| | | | |
|---|---|---|---|
| 3,572,430 | 3/1971 | Charnock, Jr. | 165/82 |
| 3,626,252 | 12/1971 | Cath | 317/100 |
| 4,000,776 | 1/1977 | Kroebig et al. | 165/32 |
| 4,052,854 | 10/1977 | due Pre et al. | 60/524 |
| 4,088,118 | 5/1978 | Benseman | 165/104.14 X |
| 4,127,105 | 11/1978 | Watt | 126/271 |
| 4,161,212 | 7/1979 | Hightower | 165/96 |
| 4,170,262 | 10/1979 | Marcus et al. | 165/105 |
| 4,388,964 | 6/1983 | Almgren et al. | 165/32 |
| 4,416,261 | 11/1983 | van der Aa | 126/433 |
| 4,420,035 | 12/1983 | Hewitt | 165/41 X |
| 4,421,104 | 12/1983 | Adcock | 126/438 |
| 4,583,584 | 4/1986 | Wepfer | 165/82 |
| 4,603,734 | 8/1986 | Heeren et al. | 165/67 |
| 4,631,388 | 12/1986 | Manning | 219/326 |
| 4,727,455 | 2/1988 | Neidig et al. | 165/104.33 X |
| 4,789,023 | 12/1988 | Grant | 165/1 |
| 4,802,532 | 2/1989 | Dawes et al. | 165/185 X |
| 4,830,097 | 5/1989 | Tanzer | 165/41 |
| 4,852,645 | 8/1989 | Coulon et al. | 165/185 X |
| 4,880,052 | 11/1989 | Meyer, IV et al. | 165/104.14 |
| 5,024,264 | 6/1991 | Natori et al. | 165/1 |
| 5,077,103 | 12/1991 | Wagner et al. | 428/34.1 |
| 5,161,884 | 11/1992 | Siminovitch | 165/46 X |
| 5,358,033 | 10/1994 | Schlitt | 165/104.26 |
| 5,378,924 | 1/1995 | Liang | 257/675 |
| 5,646,822 | 7/1997 | Bhatia et al. | 165/104.33 X |

FOREIGN PATENT DOCUMENTS

| | | |
|---|---|---|
| 0027845 | 5/1981 | European Pat. Off. . |
| 2942714 | 5/1981 | Germany . |

OTHER PUBLICATIONS

A.A. McDell; Moveable Thermal Joints For—Spacecraft; Jul. 13–15, 1987, p. 4.

*Primary Examiner*—Christopher Atkinson
*Attorney, Agent, or Firm*—Michael S. Yatsko

[57] ABSTRACT

There is provided a heat pipe assembly 10 formed of dissimilar materials for the heat pipe 18 integrated with the host structure 16 in a manner that optimizes removal of unwanted heat generated by various devices on a space or terrestrial platform 14. A conventional heat pipe construction 18 mounted within a circular cross-section channel 28 formed in a retaining block 26 leaving an annular gap 30 between the outside surface wall 33 of the heat pipe and the inside surface wall 32 of the channel 28. A heat conductive fluid 40 is injected into the annular gap 30 permitting the dissimilar CTE materials to thermally expand and contract as the platform or structure 14 experiences extreme temperature changes.

4 Claims, 2 Drawing Sheets

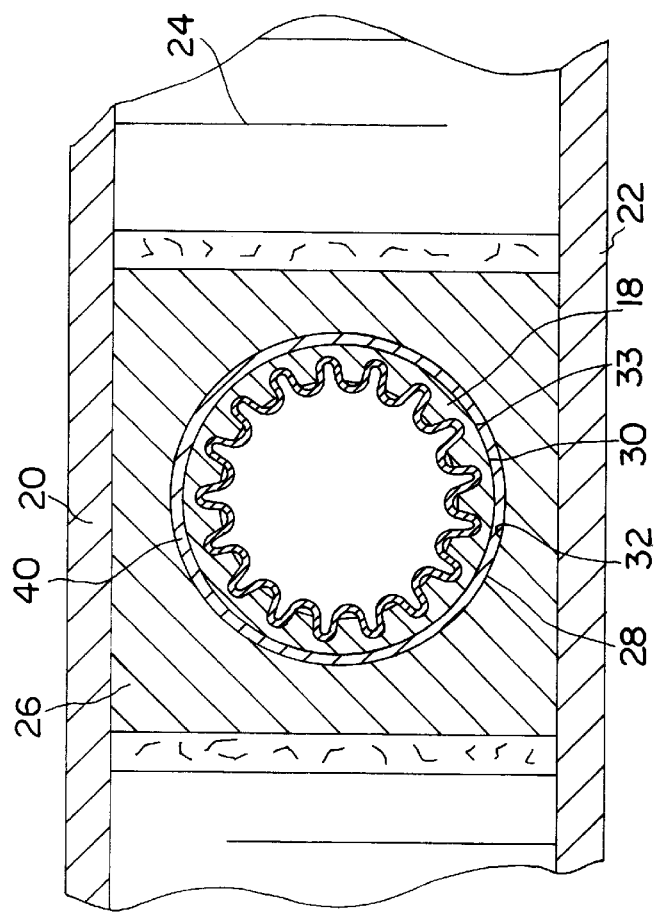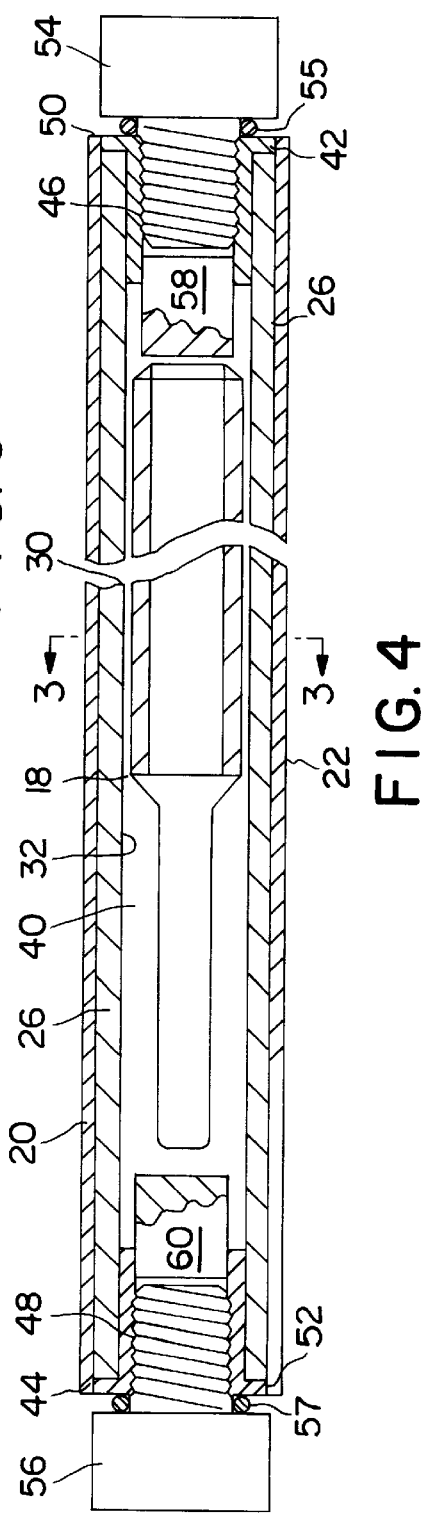

EMBEDDED HEAT PIPE STRUCTURE

BACKGROUND

This invention relates generally to the cooling of operating devices on orbiting spacecraft and more particularly to heat pipe assemblies constructed of different materials that optimize heat transfer conditions independent of thermal expansion constraints. However, the invention is also applicable to terrestrial applications.

The environmental conditions encountered by an orbiting spacecraft carrying various devices whose operation generates unwanted heat require that they be cooled if the mission is to be successful. It is well known to cool the operating devices using heat pipe assemblies that must function in a space vehicle environment that demands the use of compatible materials, light in weight and provide optimal results. Conditions are further complicated due to extreme temperature changes such as when as the spacecraft passes through the cold eclipse of its orbit and the much higher temperatures as it sees the sun's radiation. The construction and operation of heat pipes is well known such as described in U.S. Pat. No. 4,170,262 issued Oct. 9, 1979, and assigned to the same assignee as the instant invention and is incorporated herein by reference.

Effective heat removal from the operating device depends on using heat pipes such as the type described in U.S. Pat. No. 4,170,262, assigned to the same assignee as this invention, depends on transfer of heat by conduction to the heat pipe which then convects the removed heat to radiating panels that radiate the heat into ambient space. Successful operation of space missions therefore, particularly communication satellites, require cooling the various on-board devices. Good spacecraft design requires the use of lightweight materials for the construction of the apparatus essential for its mission and any ancillary equipment must be within the controlling weight limits. It is also desirable to provide conditions that optimize heat transfer by conduction and at the same time meet the preferred requirements of satellite construction calling for lightweight materials that lend themselves to easy assembly and fabrication and can survive frequent cycling over extreme temperature ranges from −50° F. to 200° F.

In practice the heat-producing operating device will have affixed to, or within its structure, a heat pipe assembly comprising a heat absorbing host structure equipped with radiating panels having embedded therein a heat pipe such as the type disclosed in the aforementioned U.S. Patent. As the heat from the operating device is conducted to the host structure, it vaporizes the working fluid in the heat pipe which is then condensed and the heat of condensation conducted to the radiating panels which dissipate it into the ambient space. The embedded heat pipe takes heat out of the operating device at its evaporator end and the vapors are condensed at its condenser end giving up heat to the host structure and discharging it to ambient space.

Currently the heat pipe assemblies are fabricated using the same materials for the host structure and the heat pipes. Such a construction strategy avoids any problem caused by components having different coefficients of thermal expansion (CTE) that could cause stress failure in the assembly. Limiting material selection is a compromise that affects the efficiency performance of the heat pipe, contributes to the weight of the satellite and is less than optimum in terms of heat removal. Recent advances in materials science that could improve the construction of heat pipe assemblies have not been realized due to the thermal stress imposed by the differential CTE between the host structure and the firmly affixed heat pipe. Thermally-induced stress causes detachment or debonding of the heat pipe from host structure and therefore failure of the thermal control system.

SUMMARY

The present invention resides in an improved heat pipe assembly for removing heat generated by an operating device by thermally integrating the heat pipe assembly with the operating device. The heat pipe assembly comprises a heat Dice thermally integrated in a host structure that includes a core material sandwiched between heat radiating facesheets. The heat pipe is received in a longitudinally extending channel formed in a retainer block which is fixed in the core material, the panel structure provides the necessary rigidity to the heat pipe assembly. The channel has a slightly larger cross-section than the heat pipe so as to envelope the heat pipe leaving a gap between the inner wall surface of the channel and the outer wall surface of the heat pipe. The gap is large enough to be filled with a heat conductive fluid forming a fluid layer between the inner wall surface of the channel and the outer wall surface of the heat pipe. The fluid filled gap permits the heat pipe and the host structure including the core material to expand and contract relative to one another without disturbing the effective transfer of heat from the heat pipe to the radiating panels and thence to ambient space.

More specifically, in a presently preferred embodiment the fluid has a heat conductive capacity integrating the heat conductive capacity of the host structure and the heat pipe.

The fluid filled gap is coextensive with the length of the heat pipe and the host structure such that it renders the elements free for independent movement relative one another without regard to their coefficients of thermal expansion while permitting utilization of materials for fabricating the host structure or the heat pipe that will provide optimum heat transfer conditions.

It will be appreciated from the foregoing that the present invention provides an improved heat pipe assembly for radiating unwanted heat generated from an operating device on-board a spacecraft that permits greater latitude in the choice of materials of construction possessing the desired heat conducting properties without concern for any difference in the their thermal expansion properties. Other features and advantages of the present invention will become apparent from the following more detailed description, taken in conjunction with the accompanying drawings, which illustrate, by way of example, the principles of the invention.

DRAWINGS

These and other features, aspects and advantages of the present invention will become better understood from the following description, appended claims, and accompanying drawings where:

FIG. 3 is a cross-section of the assembly of FIG. 4 taken along line 3—3; and

FIG. 4 is a cross-section of the assembly of FIG. 2 taken along line 4—4.

DESCRIPTION

Figure 1:
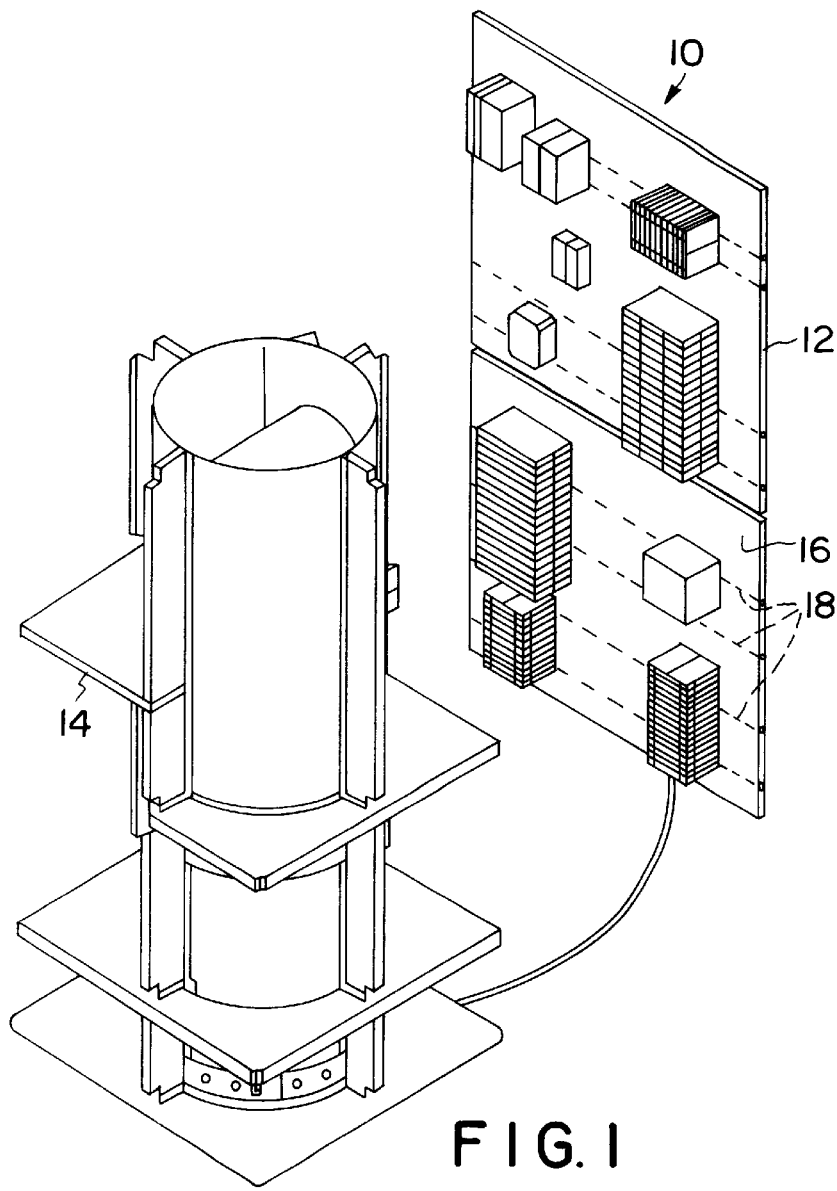
FIG. 1 is a perspective view of a spacecraft with on-board operating devices and equipped with the heat pipe assembly of this invention.

As shown in the drawings for purposes of illustration, the present invention is an improved heat pipe assembly that may be constructed of materials that optimize the heat removal function without regard to the thermal stresses introduced into the host structure by the incompatibility of the materials with which it is fabricated. Heat pipes as a heat removing device have exhibited unsurpassed thermal conductance per unit weight in the environment of space vehicles. Current heat pipe assemblies are fabricated using compatible materials such as aluminum host structures and aluminum for the heat pipe shells and ammonia as the working fluid. Stronger, lighter-weight materials with more desirable thermal properties have become available for the construction of the heat pipe shell and the host structure, but their use has been hindered because of the incompatibility arising from the mismatch of CTE characteristics.

In accordance with the present invention the construction of the heat pipe assemblies need not be constrained because of the CTE incompatibility. The heat pipe shell and the host structure designs can be optimized to satisfy the requirements to remove unwanted heat generated by the on board operating devices without regard to the thermal expansion or contraction of the materials employed.

Figure 2:
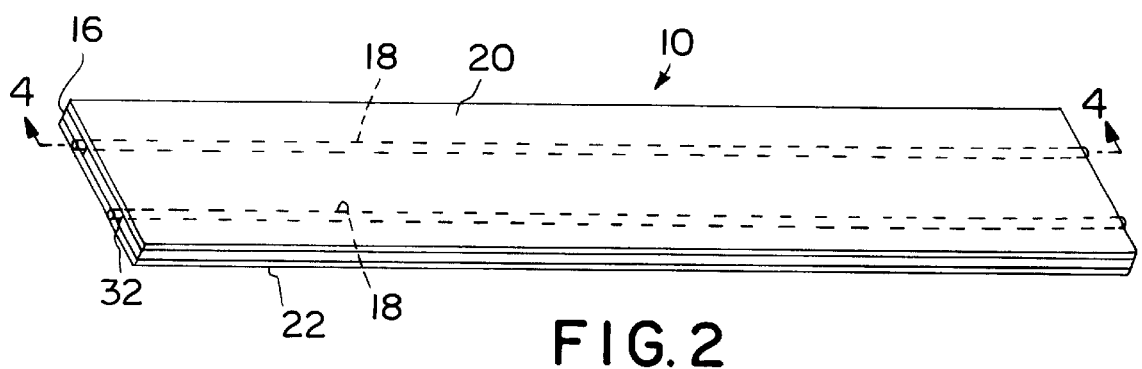
FIG. 2 is a perspective view of a host structure without the heat generating devices.

Referring to FIGS. 1 and 2 there is shown in perspective, heat pipe assemblies generally identified with the numeral 10 which, for purposes of illustration, are thermally integrated with heat generating electronic modules 12 mounted on the host structure 16 and connected to the satellite 14. It will be understood that the heat pipe assemblies 10 are similarly used throughout the spacecraft 14 to remove unwanted heat from other on-board operating devices. The electronic modules 12 generate heat during operation which must be removed to assure proper functioning of the electronic components. As shown in FIGS. 1 and 2 the host structure 16 is thermally integrated with the heat pipe assembly 10 to effectively reject the unwanted heat into ambient space. The host structure 16 has embedded therein a series of heat pipes 18 which are coextensive the full width of the host structure 16. The construction and operation of heat pipes is well known and is well described in U.S. Pat. No. such as 4,170,262.

Heretofore, host structures were fabricated using the same material as the shell of the heat pipe 18. This was accepted practice for the reason the use of materials with the same or similar CTE prevented failure of the assembly. While the use of materials with matching CTE produced satisfactory apparatus for removing the unwanted heat, the systems have been less than optimum in terms of being able to use lighter weight, stiffer, stronger, more conductive materials. Advantageously the host structure is a material selected from the group consisting of graphite, beryllium, and aluminum, stainless steel, titanium and copper.

Referring to FIGS. 2 and 3, the structure 16 is fabricated by securing a pair of face sheet members 20 and 22 (FIG. 3) in spaced apart relationship and supported by a suitable core 24. The heat pipe 18 is encased in a retaining block 26 which is formed with a channel 28. The retaining block is fixed in the core 24. It will be appreciated that the heat pipe 18, the retaining block 26, the channel 28 and the core 24 and the face sheet members 20 and 22 comprise the host structure 16. The arrangement permits the host structure 16 elements to expand and contract with one another without creating unacceptable stress in the structure. The face sheets 20 and 22 and core 24 form a support structure for the retaining block 26, and conduct heat removed by the heat pipe to the surrounding structure. The heat pipe 18 is received in a circular channel 28 within the retainer block 26 which is fixed in the core 24. The inside cross-section of the channel 28 is slightly larger than the outer cross-section of the heat pipe 18. Placement of the heat pipe 18 within the channel 28 leaves a gap 30 between the outer wall of the heat pipe and the inner wall of the channel 28. The gap 30 is coextensive with the length of inner surface 32 of the channel 28 and the outside surface 33 of the heat pipe 18. In the preferred embodiment the cross-sections are circular providing thereby an annular space 30. The gap 30 is charged with a heat conductive fluid 40. The face sheet members 20 and 22 function to radiate the heat distributed by the heat pipes 18 into ambient space.

The preferred material for the face sheet members 20, 22 and the retaining block 26 is a formulated graphite composite comprised of high conductivity impregnated carbon fibers manufactured by the Amoco Corporation of Alpharetta, Ga. or Mitsubishi Corporation of Tokyo, Japan. Other preferred materials can be beryllium, aluminum, copper and carbon-carbon (c—c) or other forms of graphite. The latitude in the selection of materials is made possible by the conductive fluid 40 which fills the gap 30 between the inner wall surface 32 of the retaining block 26 and the outside wall surface 33 of the heat pipe 18.

The thermal conductivity of fluid 40 affects the temperature drop between the retaining block 26 and the inside temperature of the heat pipe 18. The preferred embodiment utilized a fluid conductivity of 2.0 to 5.0 Watts/m°K. In determining the appropriate thermal conductivity of the fluid itself it was found good results are obtained when it has a value of in the range of 0.10 and 10.0 Watts/m°K, and is equipped with an inner working structure (not shown) and as described in the aforementioned United States Patent. It is intended when describing the arrangement of the heat pipe 18 enveloped by the retaining block 26 that it not be limited to any particular geometric configuration. The cross-section of the heat pipe 18 is chosen to be circular but could be of other geometric configurations as long as a gap is maintained between heat pipe 18 and retaining block 26. The annular space or gap 30 that is thus formed between the outer wall surface 33 and the inside wall surface 32 is filled with a heat conductive fluid 40.

A number of materials have been found useful as heat-conductive fluids 40. For example, materials such as silicon produced by the Nusil Corporation of Carpenteria, Calif., and a synthetic hydrocarbon oil produced by Penzoil of Houston, Tex. have been used. Prospectively, other fluids can be used such as silicone oil, grease. It has been found that the size of the gap across which the heat is to be conducted to the face sheet members 20 and 22 is important. The operable range for this gap using the optimum materials for the retaining block 26 and the heat pipe 18 is in the range of 3 mils to 30 mils. The smaller the annular space 30 the more effective the conductance. The preferred range is from 12 mils to 15 mils. The conductivity of any fluid that may be used is enhanced when it functions as a carrier for high thermally conductive particles. When using the silicone oil as a carrier it has been found that by imparting 30–60% by weight of particles of boron nitride significantly enhances the conductivity. Prospectively, such powdered materials as aluminum, iron, silver, aluminum nitride, diamond, or other conductive powders when added to the carrier fluid in an amount ranging up to 95% by weight of the carrier fluid could be useful. The size of the conductive particles may range from 00.10 microns to 100 microns.

It will be appreciated that the size of the gap 30 plays an important role in the effectiveness with which heat is conducted away from the operating device but it can also affect the manufacturing procedures. A small gap in the range of 3–10 mils may require the use of a heat conductive fluid without any additives and manufacture becomes quite routine. As the gap is made larger it reduces the effective conductance and alternatively the fluid 40 may be charged with heat conductive particles to enhance conductivity. Filling the gap with a fluid that carries 95% by weight of the metal powder becomes more difficult due to the high viscosity of the fluids. However, the inventive concept makes possible a range of options that may be selected to meet a particular heat removable requirement and/or manufacturing process.

It will be understood that reference herein to a fluid includes gases as well as liquids and gels and the use of fluids as carriers for particulate matter that enhances the heat conductivity of the fluid 40. Prospectively, gases may be used as the fluid selected from the group consisting of argon, helium or nitrogen or mixtures thereof.

Turning now to FIG. 4 there is shown a longitudinal cross-section of the heat pipe assembly 10 illustrating the details of its envelopment within the host structure 16 and the containment of the heat conductive fluid 40. The retaining block 26 within the host structure 16 has openings at either of the longitudinal ends 42 and 44 into which is received the heat pipe 18. As described earlier the cross-section of the panel 12 has a larger cross-sectional diameter than the cross-section of the heat pipe 18 so that its envelopment leaves a slight annular gap 30 between the outer heat pipe wall surface 33 and the inner wall surface 32 of the channel 28, within the retaining block 26.

The openings 42 and 44 have inside threaded portions 46 and 48, respectively, and are fixtured to appropriately seal off the openings to contain the heat conductive fluid 40 within the fittings 50 and 52. Into the fittings 50 and 52, there is inserted end screw caps 54 and 56 respectively that close off the longitudinal openings after the injection of heat conductive fluid 40 has filled the annular gap 30. It has been found that the gap is preferably void of any retained air and completely filled with the heat conductive fluid.

Near each end of the channel 28 disposed between the ends of the heat pipe 18 and the end screw caps 54 and 56 there is interposed resilient reservoirs 58 and 60. The resilient capsule responds to the thermal expansion and contraction of either the retaining block 26 or the heat pipe 18 by expanding and contracting as necessary. The capsules 58 and 60 serve to relieve a pressure increase in the fluid 40 by contracting, and prevent a void from forming by expanding.

To assure a more effective liquid seal "O" rings 55 and 57 are captured between the screw caps 54 and 56 and the fittings 50 and 52.

Although the present invention has been described in considerable detail with reference to certain preferred versions thereof, other versions are possible. Therefore, the scope of the appended claims should not be limited to the description of the preferred versions contained herein.

What is claimed is:

1. A heat pipe assembly including a thermally integrated heat pipe disposed in a host structure for conducting heat away from a heat generating body, comprising:

an elongated heat pipe contained in a channel opening within the host structure, wherein said heat pipe is adapted to move independently of said host structure, so that the host structure and the heat pipe are free to thermally expand and contract relative to one another, said channel opening having an inner wall surface and said heat pipe having an outer wall surface, said heat pipe being coextensively enveloped by said host structure along its longitudinal extent with its outer wall surface spaced apart from the inner wall surface of the host structure forming a finite gap therebetween;

a sealing device for sealing the ends of the channel opening in said host structure;

a fluid filling said gap for independently supporting the heat pipe radially and axially within the host structure; and an expansion device disposed within at least one end of the host structure between said sealing device and said heat pipe for permitting the heat pipe to expand axially within the host structure and independent from the fluid, whereby the thermal integration of the heat pipe relative to the host structure and the heat generating body is maintained.

2. A heat pipe assembly for conducting heat away from a heat generating body, comprising:

a host structure, said host structure including a retainer block equipped with an elongated channel member having an inner wall surface and an opening at each end of said channel member;

an elongated heat pipe for collecting heat having an outer wall surface and being contained in said host structure, said heat pipe being concentrically received within the elongated channel member so that the outer wall surface is spaced apart from the inner wall surface leaving a gap between the heat pipe and the inner wall surface, said elongated heat pipe being independent of and freely movable within said channel member;

sealing means for sealing the openings of said channel member;

fluid means disposed in said gap for conducting the heat to the retainer block; whereby the heat pipe is permitted to move independently of said elongated channel member without disturbing the conduction of heat to the retainer block; and at least one elastic capsule disposed between the sealing means and the heat pipe, said capsule being operative to expand or contract in response to contraction or expansion of either the heat pipe or the retainer block, thereby maintaining pressure in the channel member.

3. The invention as claimed in claim 2 wherein the fluid means is a material selected from the group consisting of silicon oil, hydrocarbon oil and grease.

4. The invention as claimed in claim 3 wherein the fluid means contains conductive powdered particles being selected from the group consisting of aluminum, diamond, iron, silver, aluminum nitride, and boron nitride.

* * * * *